(12) United States Patent
Schairer

(10) Patent No.: US 6,320,686 B1
(45) Date of Patent: Nov. 20, 2001

(54) COMPONENT FOR OPTICAL DATA TRANSMISSION

(75) Inventor: Werner Schairer, Weinsberg (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/104,766

(22) Filed: Jun. 25, 1998

(30) Foreign Application Priority Data

Jun. 28, 1997 (DE) .................................................. 197 27 632

(51) Int. Cl.$^7$ ....................................................... H04B 10/24
(52) U.S. Cl. ................................................. 359/152; 359/153
(58) Field of Search ..................................... 359/152, 153, 359/163; 257/78, 79

(56) References Cited

U.S. PATENT DOCUMENTS

| | | |
|---|---|---|
| 4,721,384 * | 1/1988 | Dietrich et al. ........................... 356/1 |
| 5,140,152 | 8/1992 | Van Zeghbroeck . |
| 5,267,070 * | 11/1993 | Stewart et al. ......................... 359/141 |
| 5,506,445 | 4/1996 | Rosenberg ............................. 257/666 |

FOREIGN PATENT DOCUMENTS

| | | |
|---|---|---|
| 2629356 | 1/1978 | (DE) . |
| 19508284 | 1/1996 | (DE) . |
| 2011610 | 7/1979 | (GB) . |
| 04237005 | 8/1992 | (JP) . |

OTHER PUBLICATIONS

"IrDA–Compatible Data Transmission", Design Guide Apr. 1996, published by TEMIC semiconductors, pp. 11, 39, 46.

\* cited by examiner

Primary Examiner—Leslie Pascal
(74) Attorney, Agent, or Firm—W. F. Fasse; W. G. Fasse

(57) ABSTRACT

An optical infrared transceiver for a directed bi-directional optical data transmission through the atmosphere has a stack formed of an emitter chip for transmitting IR beams, a detector chip for receiving IR beams, an integrated circuit for amplifying the transmission and reception power, and a lens aligned with the stack along an optical axis for focusing the transmitted and received beams, whereby received and transmitted beams pass through the same lens.

10 Claims, 1 Drawing Sheet

STATE OF ART

COMPONENT FOR OPTICAL DATA TRANSMISSION

FIELD OF THE INVENTION

The invention relates to an optical transmitter and receiver combination arranged concentrically to each other for infrared transceiving through the atmosphere.

BACKGROUND OF THE INVENTION

The invention relates to an optical infrared receiver-transmitter for a directed bi-directional optical data transmission where in a single-part or multi-part housing the following are arranged as components: an emitter chip for transmitting IR beams, a detector chip for receiving IR beams, an integrated circuit for amplifying the transmission and reception power, as well as an optical system complete with an optical axis for focusing the transmitted and received beams.

Such an arrangement, also designated as a transceiver, is used for data transmission in IrDA applications. For data transmission by means of an optical point-to-point transmission route, the IrDA (Infrared Data Association) standard has been developed. For example, integrated transceiver components known by the designation TFDS 3000 or TFDS 6000 are available from TEMIC TELEFUNKEN microelectronic GmbH, which components correspond to the IrDA standard.

According to the state of the art, in a common transceiver housing there are arranged an infrared transmitter (emitter), an infrared receiver (detector), and an integrated circuit for signal processing. A surface of the transceiver component holds two lens-shaped moldings located adjacent to each other, in whose focal points a transmitter and a receiver are respectively located. These optical systems are necessary in order to achieve the directional signal emission of the transmitter and the directional sensitivity of the receiver required by the IrDA standard.

Such transceivers have the disadvantage that due to the transmitter and the receiver being located adjacent to each other, they each require their own respective optical system in order to be able to achieve the required directional signal transmission of the transmitter and the directional sensitivity of the receiver. This causes very high material costs, and the dimensions of the transceiver component will be relatively large.

SUMMARY OF THE INVENTION

The object of the invention is to provide an infrared transceiver having dimensions which are significantly smaller so that material costs and space requirements will be reduced.

According to the invention an optical infrared transceiver for a directed bi-directional optical data transmission combines the following features in a single-part or multi-part housing: an emitter chip for transmitting IR beams, a detector chip for receiving IR beams, a metallization between the chips, an integrated circuit for amplifying the transmission and reception power, an optical lens with an optical axis for focusing the transmitted and received beams, wherein the detector chip and the emitter chip are arranged one on top of the other and on the integrated circuit and concentrically to the optical axis of the optical lens thereby forming a stack.

The advantages of the invention are that it is possible to use a common optical lens for both, transmitter and receiver; this reduces the dimensions of the transceiver very considerably and provides savings in material costs. In addition, shorter bond wires will reduce the interference sensitivity of the component.

Further advantageous applications of the invention are described below.

BRIEF DESCRIPTION OF THE DRAWINGS

Two example embodiments of the invention are described in detail below and illustrated in the accompanying drawings, wherein.

DETAILED DESCRIPTION OF THE PREFERRED EMBODIMENTS AND OF THE BEST MODE OF THE INVENTION

Figure 2:
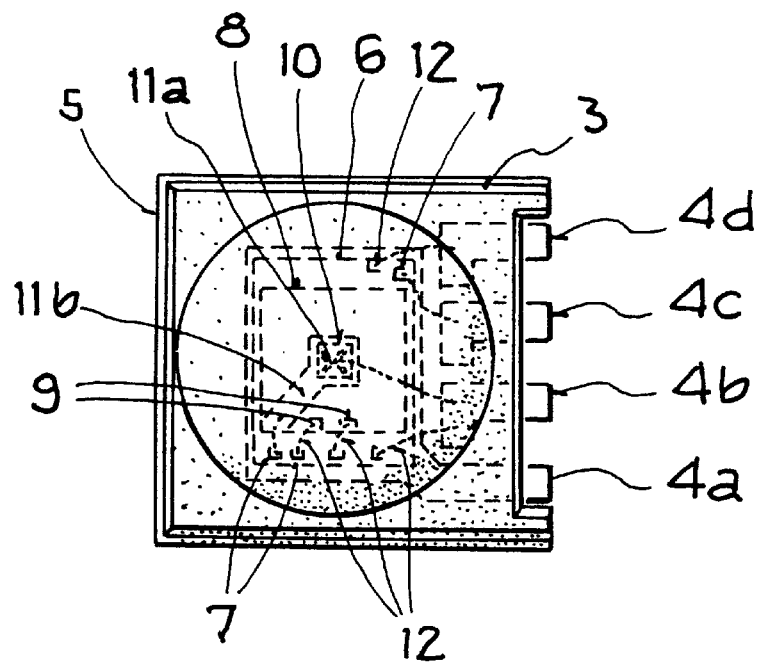
FIG. 2 shows a cross-section of the transceiver according to FIG. 1.
Figure 1:
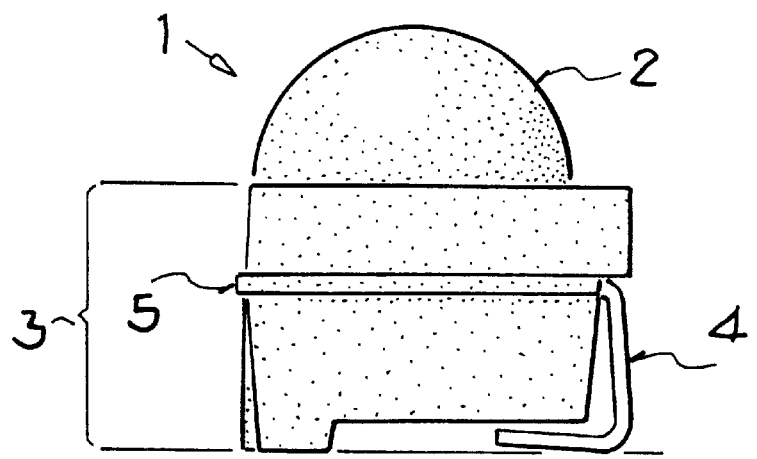
FIG. 1 is a side view of a transceiver according to the invention.

FIGS. 1 and 2 show an infrared transceiver 1 with a lens 2 as an optical system, a housing 3 made, for example, of a thermoplastic or thermosetting compound that is transparent for IR beams. Terminal pins 4 lead to the outside as a part of a metallic strip carrier 5. A grounding terminal 4a (GND) is connected to a reference potential, a terminal pin 4b (Vcc) is connected to the supply voltage, a terminal 4c (RxD) is connected to the data input, and a terminal pin 4d (TxD) is connected to the data output of a drive circuit (not shown).

An integrated circuit 6 is mounted on the carrier 5 for amplifying the signals. Contact pads 7 are part of the integrated circuit. A backside contact of the integrated circuit 6 is connected to the grounding terminal 4a (GND). In the integrated circuit 6, a photo PIN diode is arranged as a receiver or detector chip 8 which includes contact pads 9. This photo PIN diode is a special IrDA product which, however, has been produced by means of a technology that is standard for photo PIN diodes. In order to facilitate making the electrical contact, the pads 9 are preferably located on the front, that is, on the side facing the IR beams to be received. The surface of the detector chip 8 comprises a metallization 11a, 11b extending to its outer boundary. The metallization serves as a mounting surface 11a as a rear side contact for a transmitter or emitter chip 10 and as a connection or terminal pad 11b.

The transmitter or emitter chip 10 is bonded concentrically onto the detector chip 8. This transmitter or emitter chip 10 is basically a known infrared transmission diode. In order to make contact, there is a contact surface 11a located at the center of the emitter chip 10 and a connection pad 11b led out by means of a conductive connection (metallization).

The surface area of the integrated circuit 6 is larger than the surface area of the detector chip 8 whose surface area is larger than the surface area of emitter chip 10. For signal transmission, conventional contacts will be made between the individual connection pads 7, 9, 11a or 11b, amongst each other, or to terminals 4b, 4c, or 4d by means of bond wires 12 made of gold, aluminum, or an alloy having good conductive characteristics.

For example, in order to mount the integrated circuit 6 on the strip carrier 5, the detector chip 8 to the integrated circuit 6, and the emitter chip 10 to the detector chip 8, polyamide adhesive, solder, synthetic solder, or another standard synthetic adhesive is used to form a stack. In order to ensure that the emitter chip 10 is conductively mounted on the detector chip 8, different adhesives or solders may be used respectively for the various individual bonds. The connection between the integrated circuit 6 and the detector chip 8 may be conductive or non-conductive, whereby the non-conductive connection is preferred.

The optical lens 2 which, in the simplest case, is a lens made of synthetic material, has been designed such that radiation coming from the emitter chip 10 will be optimally emitted, and incoming radiation will be optimally focused on the detector chip 8. This is made possible by the detector chip 8 and the emitter chip 10 being no longer located side by side as before, but stacked one above the other. Compared to the state of the art where an emitter and detector each require their own optical system, this stacked arrangement saves an optical system and the width of the transceiver 1 is approximately only half as wide.

Figure 3:
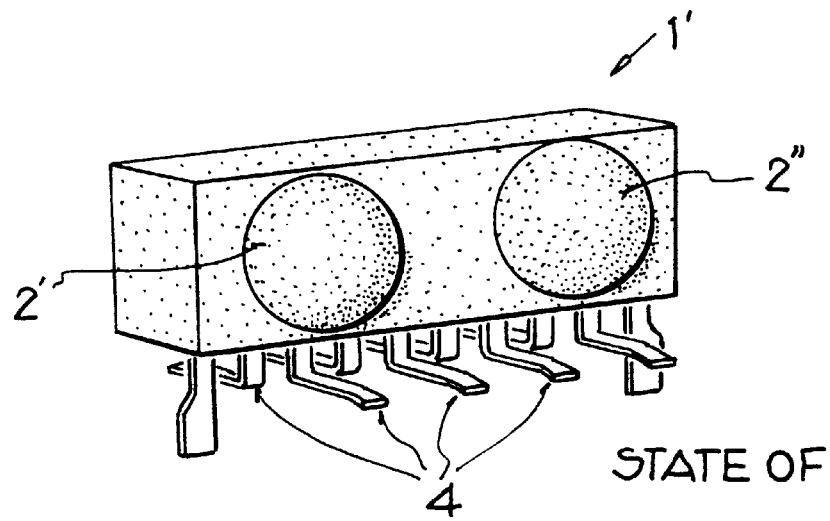
FIG. 3 is a perspective view of a transceiver according to the state of the art.

FIG. 3 shows a transceiver 1' according to the state of the art. Since the detector chip and the emitter chip are located side-by-side inside the housing, the emitter chip and the detector chip require each its own lens 2' or 2". For this reason, and due to the fact that the terminals 4 of the detector and the emitter are led out separately, transceiver 1' will increase to twice the width (approximately) when compared to the arrangement according to the invention.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An optical infrared transceiver for a bidirectional optical data transmission through the atmosphere, said optical infrared transceiver comprising a housing, an integrated circuit mounted in said housing for amplifying received and transmitted IR energy, an emitter chip for transmitting IR beams, a detector chip for receiving IR beams, a metallization on a central surface area between said detector chip and said emitter chip, said detector chip and said emitter chip forming a stack with said metallization between said emitter chip and said detector chip in said stack mounted in said housing, said stack having an optical axis centrally through said central surface area, an optical lens optically aligned with said optical axis for focusing received IR beams onto said detector chip and transmitted IR beams from said emitter chip; and wherein said integrated circuit has a first surface area, wherein said detector chip has a second surface area, wherein said emitter chip has a third surface area, wherein said first surface area is larger than said second surface area, and wherein said second surface area is larger than said third surface area.

2. The optical infrared transceiver of claim 1, wherein said emitter chip is positioned between said metallization and said optical lens to face said optical lens.

3. The optical infrared transceiver of claim 1, wherein said metallization on said detector chip forms at least one terminal pad, said optical infrared transceiver further comprising at least one bonding wire electrically connected to said terminal pad.

4. The optical infrared transceiver of claim 1, further comprising a metal coating on a surface of said emitter chip opposite said metallization, and a conductor of solder or conductive adhesive connecting said metal coating with said metallization.

5. The optical infrared transceiver of claim 1, further comprising electrical terminals (4), connector pads as part of said integrated circuit of said emitter chip and of said detector chip, and bonding wires interconnecting said connector pads and said electrical terminals.

6. The optical infrared transceiver of claim 1, further comprising a carrier (5) on which said stack is mounted in said housing.

7. The optical infrared transceiver of claim 6, wherein said carrier is a metallic strip carrier.

8. The optical infrared transceiver of claim 1, wherein said housing is made of a thermoplastic or a thermosetting sealing compound that is transparent to IR beams.

9. An optical infrared transceiver for a bidirectional optical data transmission through the atmosphere, said optical infrared transceiver comprising a housing, an integrated circuit mounted in said housing for amplifying received and transmitted IR energy, an emitter chip for transmitting IR beams, a detector chip for receiving IR beams, a metallization on a central surface area between said detector chip and said emitter chip, said detector chip and said emitter chip forming a stack with said metallization between said emitter chip and said detector chip in said stack mounted in said housing, said stack having an optical axis centrally through said central surface area, an optical lens optically aligned with said optical axis for focusing received IR beams onto said detector chip and transmitted IR beams from said emitter chip; and wherein said housing comprises at least two sections, and further comprising a carrier on which said stack is mounted in said housing, said carrier dividing said housing into said at least two sections.

10. The optical infrared transceiver of claim 9, wherein said housing is made of a thermoplastic or a thermosetting sealing compound that is transparent to IR beams.

* * * * *